United States Patent [19]

Fukuda et al.

[11] Patent Number: 5,735,408
[45] Date of Patent: Apr. 7, 1998

[54] CASSETTE STORING ELECTRONIC COMPONENTS CAPABLE OF INHIBITING ELECTRONIC COMPONENTS FROM MUTUAL CONTACT

[75] Inventors: Kenichi Fukuda; Toshikuni Hisaki, both of Takefu, Japan

[73] Assignee: Murata Manufacturing Co., Ltd., Nagaokakyo, Japan

[21] Appl. No.: 833,117

[22] Filed: Apr. 4, 1997

Related U.S. Application Data

[63] Continuation of Ser. No. 517,673, Aug. 22, 1995, abandoned.

[30] Foreign Application Priority Data

Aug. 26, 1994 [JP] Japan ................... 6-202404

[51] Int. Cl.$^6$ .......................................... B65D 73/02
[52] U.S. Cl. .................. 206/723; 206/701; 206/718; 221/156
[58] Field of Search .................. 206/701, 718, 206/722, 723; 221/156, 172

[56] References Cited

U.S. PATENT DOCUMENTS

| | | | |
|---|---|---|---|
| 3,355,002 | 11/1967 | Greck | 221/156 |
| 3,393,797 | 7/1968 | Flood | 206/723 |
| 3,430,809 | 3/1969 | Vanstrom | 206/718 |
| 3,508,639 | 4/1970 | Braden | 221/156 |
| 4,037,267 | 7/1977 | Kisor | 206/718 |
| 4,353,481 | 10/1982 | Tando | 206/718 |
| 4,359,157 | 11/1982 | Horstmann | 206/718 |
| 4,681,480 | 7/1987 | Eigenmann | 221/156 |
| 4,706,812 | 11/1987 | Spinelli et al. | 206/718 |
| 4,846,345 | 7/1989 | Hamuro et al. | 206/701 |
| 4,889,229 | 12/1989 | Yamamoto et al. | 206/328 |
| 4,979,640 | 12/1990 | Konishi et al. | 221/172 |

OTHER PUBLICATIONS

High Temperatures–High Pressures, 1995/1996, vols. 27/28, pp. 523-546 "Mechanism of the Solvent–Assisted Graphite to Diamond Transition under High Pressure: Implications for the Selection of Catalysts".

*Primary Examiner*—David T. Fidei
*Attorney, Agent, or Firm*—Burns, Doane, Swecker & Mathis, LLP

[57] ABSTRACT

A cassette storing electronic components, which is employed for supplying a plurality of electronic components to an apparatus for mounting electronic components, comprises a plurality of electronic components and a case having a storage space provided in its interior for storing the electronic components and a discharge port communicating with the storage space for discharging the electronic components. In this cassette storing electronic components, the case is provided with a plurality of plate type baffle walls for partially blocking the storage space. Consequently, movement of the electronic components in the case can be suppressed by the baffle walls even if the cassette is extremely moved in a state attached to a mounting machine. Thus, the electronic components as well as the case can be inhibited from reduction in quality, while the number of reusable times of the case can be increased.

22 Claims, 12 Drawing Sheets

CASSETTE STORING ELECTRONIC COMPONENTS CAPABLE OF INHIBITING ELECTRONIC COMPONENTS FROM MUTUAL CONTACT

This application is a continuation of application Ser. No. 08/517,673, filed Aug. 22, 1995, now abandoned.

BACKGROUND OF THE INVENTION

1. Field of the Invention

The present invention relates to a cassette storing a plurality of electronic components in a case, which is employed for supplying the plurality of electronic components to an apparatus for mounting electronic components, and more particularly, it relates to an improvement in the case of such a cassette.

2. Description of the Background Art

For example, U.S. Pat. No. 4,889,229 describes a cassette storing electronic components which is of interest to the present invention. The conventional cassette storing electronic components is now described with reference to FIGS. 17 to 20.

The cassette 1 storing electronic components comprises a case 2 which is made of resin, for example. Preferably, the case 2 is transparent. This case 2 has a storage space 3 in its interior. As shown in FIG. 20, the storage space 3 stores a plurality of chip-type electronic components 4, for example. The case 2 is provided with a discharge port 5, which communicates with the storage space 3 for discharging the electronic components 4.

This case 2 is 110 mm by 36 mm by 12 mm, for example, and its thickness is about 1.2 mm except a portion having a specific structure.

The aforementioned discharge port 5 is openably closed with a lid 6. This lid 6 is formed by a flexible plate such as a metal thin plate or a resin thin plate, for example. The lid 6 is slidable along a slit 7 which is provided in the case 2, thereby implementing states closing and opening the discharge port 5 as shown in FIGS. 18 and 19 respectively.

A switching operation member 8 is provided in order to open and close the lid 6. This switching operation member 8 is fixed to an end of the lid 6, and forms a projection 9. On the other hand, the case 2 is provided with projections 10 and 11. The projection 9 goes over the projection 10 to maintain the lid 6 in the closed state shown in FIG. 18, while the projection 9 goes over the projection 11 to maintain the lid 6 in the open state shown in FIG. 19.

As shown in FIG. 20, this cassette 1 is attached to a hopper 12 which is provided on an apparatus for mounting the electronic components 4, i.e., a mounting machine, in order to supply the electronic components to the mounting machine. A pair of ribs 13, only one of which is shown in FIG. 17, are employed in order to attach the cassette 1 to the hopper 12. Namely, the hopper 12 is provided with grooves (not shown) for slidably receiving the pair of ribs 13 respectively.

The cassette 1 which is attached to the hopper 12 is inclined at about 45° along its longitudinal direction to downwardly direct the discharge port 5. After the cassette 1 is attached to the hopper 12 in this manner, the switching operation member 8 is operated to open the lid 6. Thus, the electronic components 4 pass through the discharge port 5, to be temporarily stored in a storage space 14 provided in the hopper 12. An aligning passage 15 is provided in communication with a lower end portion of the storage space 14.

The aligning passage 15 is adapted to align the electronic components 4 with each other along a prescribed direction. The hopper 12 is detachable from the body of the mounting machine, so that the electronic components 4 remaining therein can be readily removed for changing the type of the electronic components 4 which are supplied to the mounting machine.

The electronic components 4 which are discharged from the aligning passage 15 of the hopper 12 are along the constant direction. These electronic components 4 are held by a vacuum suction chuck (not shown), for example, and carried onto proper circuit boards, to be mounted thereon. The mounting machine is provided with a plurality of hoppers 12 shown in FIG. 20 with cassettes 1 attached thereto so that a plurality of types of electronic components 4 can be successively mounted on the circuit boards. Such hoppers 12 and cassettes 1 are arranged at regular intervals to overlap with each other along the direction of thicknesses thereof, i.e., perpendicularly to the plane of FIG. 20, and the plurality of hoppers 12 are moved along the direction of the thicknesses, in order to supply desired electronic components 4 to a position for taking out the same by the vacuum suction chuck or the like.

In order to efficiently carry out the step of mounting the electronic components 4, the aforementioned movement of the hoppers 12 is desirably carried out at the highest speed, and a time up to stoppage after the movement is desirably minimized. Thus, high-speed movement and abrupt stoppage are repeated on each hopper 12, followed by similar operations on each cassette 1.

When impacts are applied to the cassette 1 for moving the same at a high speed and abruptly stopping the same as described above, however, the electronic components 4 are extremely shaken in the storage space 3 of the case 2. Such a phenomenon remarkably appears as the rate of the electronic components 4 which are charged in the storage space 3 is reduced. Consequently, the following problems may be encountered:

The electronic components 4 collide with each other so hard that the same may be chipped or cracked. Due to such mutual collision, further, electrodes which are formed on the surfaces of the electronic components 4 as well as portions provided with no such electrodes may be stained, leading to imperfect soldering and deterioration of insulation resistance, as well as to a defect such as an electrical short at the worst. Further, stains of the electrodes may adhere to the transparent case 2 to deteriorate its appearance, or a number of flaws may appear on the inner surface of the case 2 to extremely deteriorate its quality. In this case, the case 2 cannot be reused.

The aforementioned problems may be encountered not only in the case of attaching each cassette 1 to the mounting machine, but during transportation of the cassette 1.

SUMMARY OF THE INVENTION

Accordingly, an object of the present invention is to reduce the cost for a case in a cassette storing electronic components.

Another object of the present invention is to provide a cassette storing electronic components which can reduce occurrence of defects in the electronic components.

A cassette storing electronic components according to the present invention, which is attached to an apparatus for mounting electronic components in order to supply a plurality of electronic components thereto, comprises a plurality of electronic components, and a case which is provided with a storage space for storing the plurality of electronic components in its interior and a discharge port communicating with the storage space for discharging the electronic components. The aforementioned case is provided with a baffle wall for partially blocking the storage space.

The aforementioned baffle wall is adapted to suppress movement of the electronic components in the storage space, while reducing the frequency of mutual contact between the electronic components. Therefore, collision between the electronic components can be relieved, whereby the electronic components can be prevented from cracking and chipping while surface portions of the electronic components provided with electrodes and with no such electrodes can be prevented from being stained. Thus, imperfect soldering, deterioration of insulation resistance, or a defect such as an electrical short can be reduced. The case can also be inhibited from defective appearance or reduction of quality resulting from adhesion of stains or occurrence of flaws, and the number of reusable times of the case can be increased. Consequently, the cost for the case provided on the cassette storing electronic components can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 17:
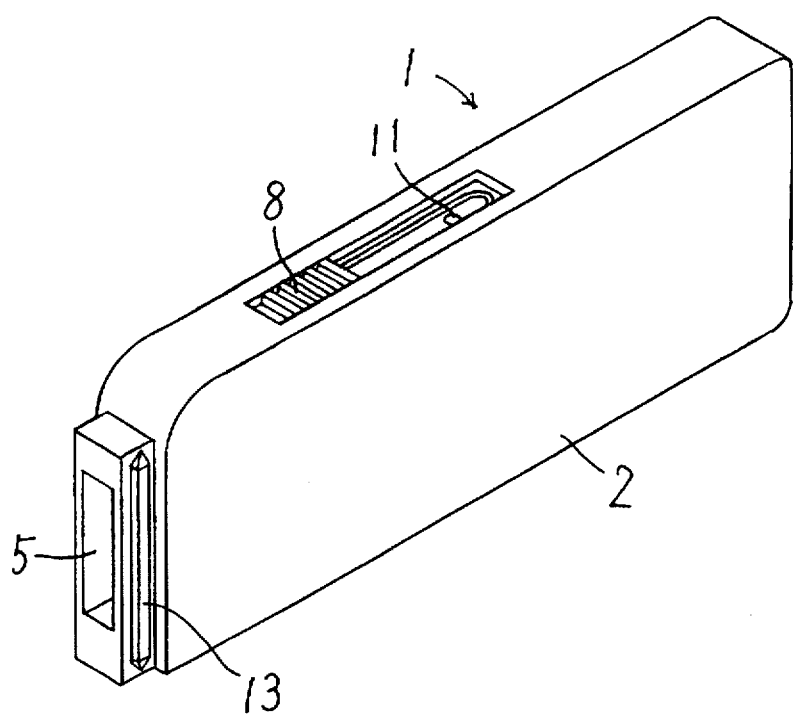
FIG. 17 is a perspective view showing the appearance of a conventional cassette 1 storing electronic components.
Figure 18:
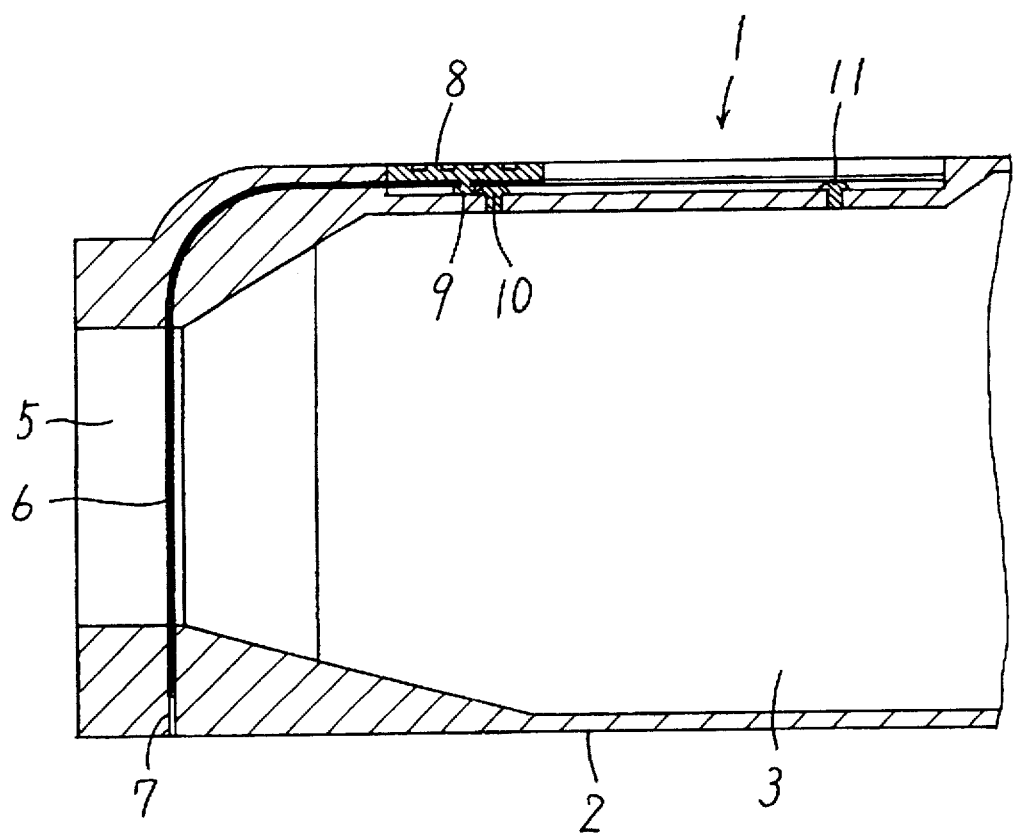
FIG. 18 is an enlarged front elevational view partially showing a longitudinal section of the cassette 1 storing electronic components shown in FIG. 17, with a lid 6 which is in a closed state.
Figure 19:
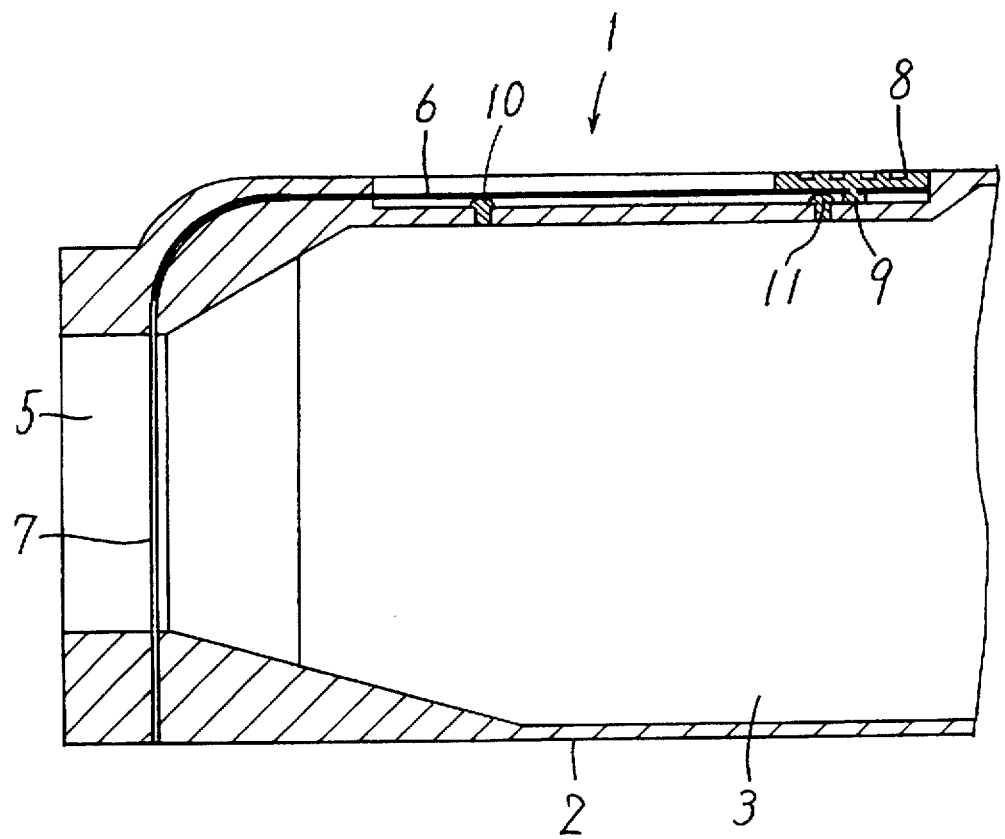
FIG. 19 is a view corresponding to FIG. 18, showing the lid 6 which is in an open state.
Figure 20:
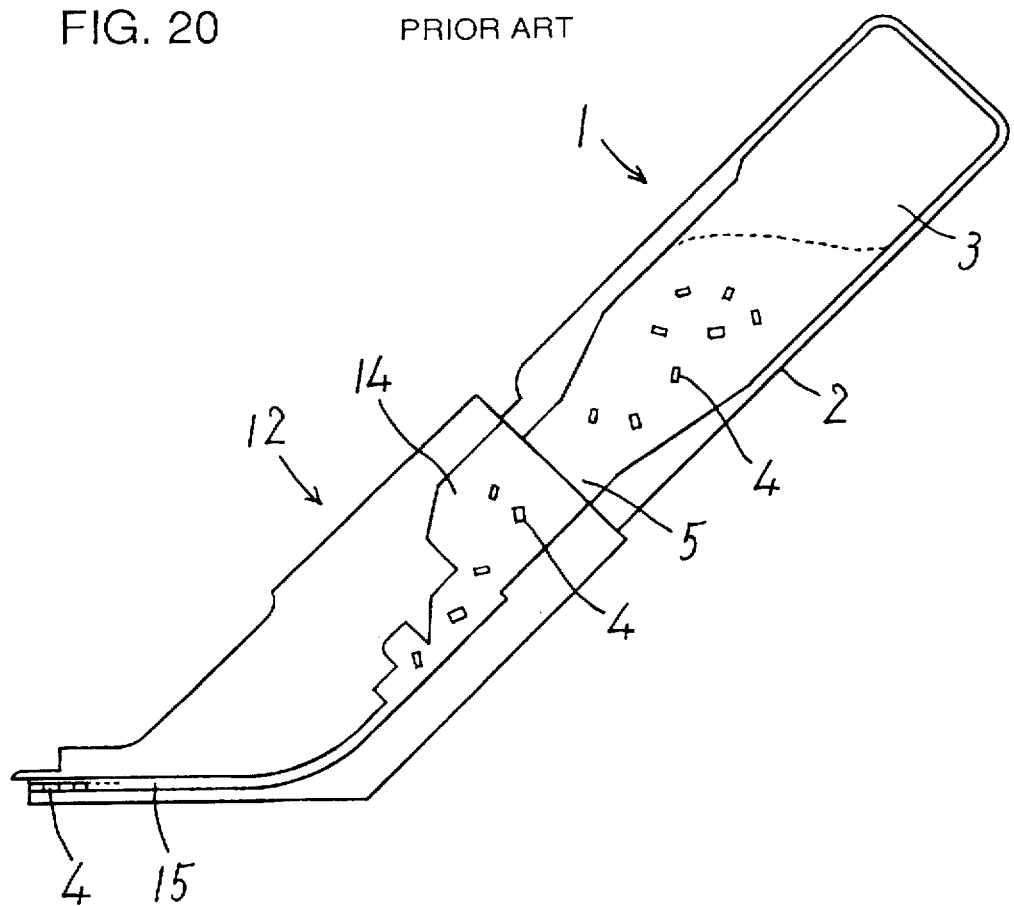
FIG. 20 is a front sectional view showing a longitudinal section of the cassette 1 storing electronic components shown in FIG. 17 in a state attached to a hopper 12 of a mounting machine.

FIGS. 1 to 16 show some embodiments of the present invention. Cassettes 16 to 30 storing electronic components shown in these figures, comprising elements which are substantially identical to those of the cassette 1 storing electronic components shown in FIGS. 17 to 19 respectively, are in structures including baffle walls which are newly added thereto. Referring to FIGS. 1 to 16, therefore, the elements corresponding to those shown in FIGS. 17 to 19 are denoted by similar reference numerals, to omit redundant description. FIGS. 1 to 16 omit electronic components 4, lids 6, switching operation members 8 and elements which are related thereto.

The cassettes 16 to 30 shown in FIGS. 1 to 16 respectively have such common structures that baffle walls are provided in cases 2 for partially blocking storage spaces 3.

Figure 1:
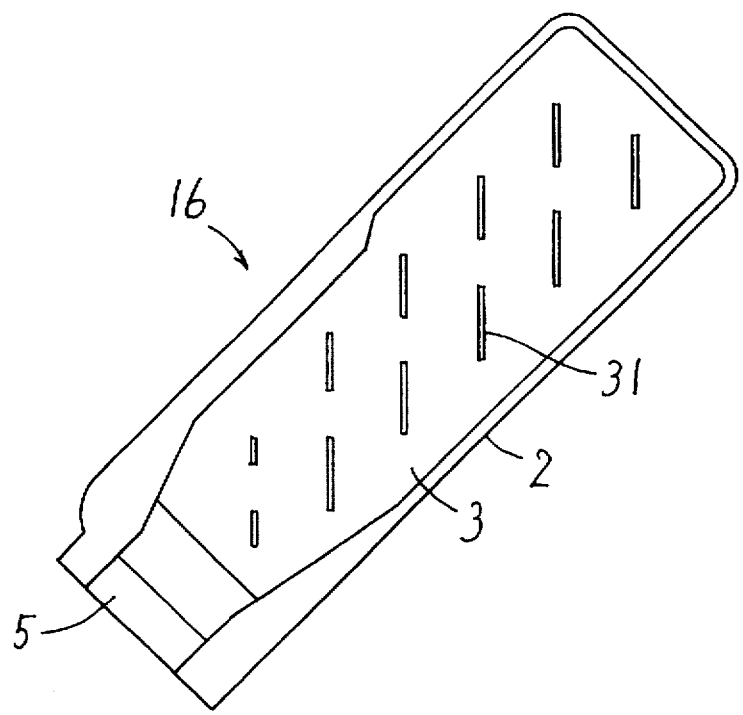
FIG. 1 is a front elevational view showing a longitudinal section of a cassette 16 storing electronic components according to a first embodiment of the present invention.

The cassette 16 shown in FIG. 1 is provided with a plurality of plate type baffle walls 31 to cross the storage space 3 along its thickness. The respective baffle walls 31 extend in the vertical direction upon inclination of the cassette 16 at about 45° along its longitudinal direction. When the cassette 16 is thus inclined, the ranges in which the electronic components 4 are horizontally freely movable are effectively controlled by the baffle walls 31. Thus, movement of the electronic components 4 in the storage space 3 is suppressed.

Figure 2:
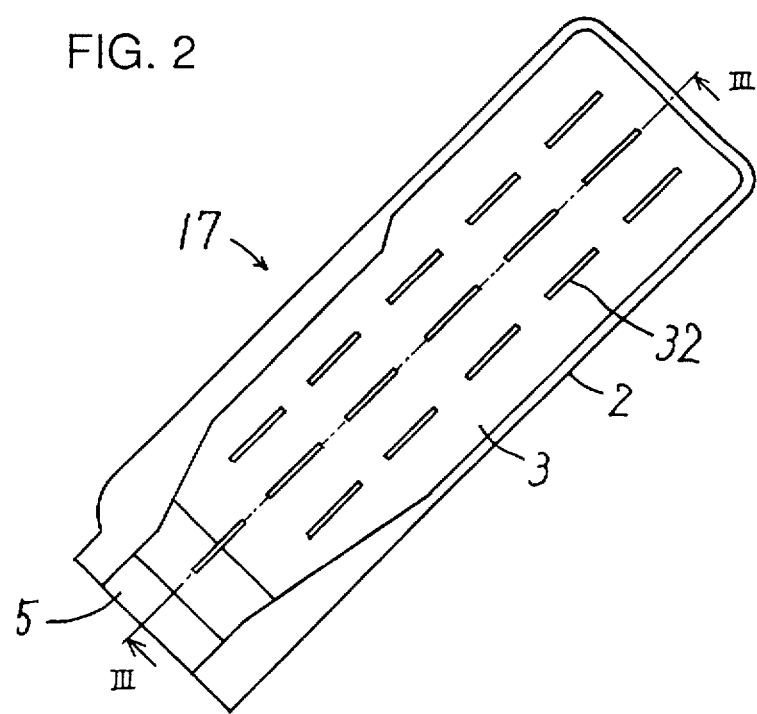
FIG. 2 is a view corresponding to FIG. 1, showing a cassette 17 storing electronic components according to a second embodiment of the present invention.
Figure 3:
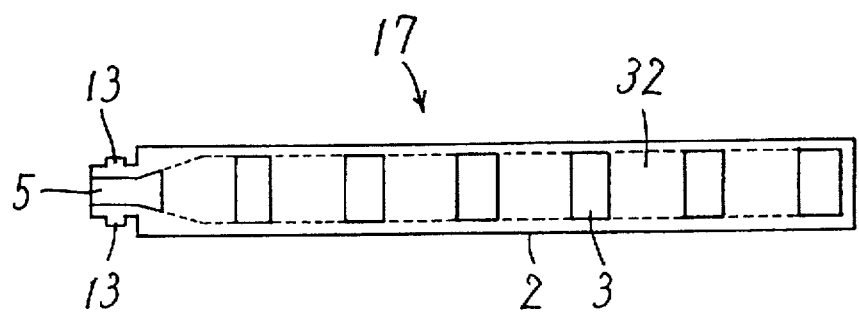
FIG. 3 is a sectional view taken along the line III—III in FIG. 2.

In the cassette 17 shown in FIG. 2, a plurality of plate type baffle walls 32 are arranged in three lines to extend along the longitudinal direction of the case 2. Due to such a direction of arrangement of the baffle walls 32, the electronic components 4 can be smoothly charged from a discharge port 5 so that the case 2 is reused. As shown in FIG. 3 which is a sectional view taken along the line III—III in FIG. 2, the baffle walls 32 extend along the overall range of the thickness of the storage space 3.

Figure 4:
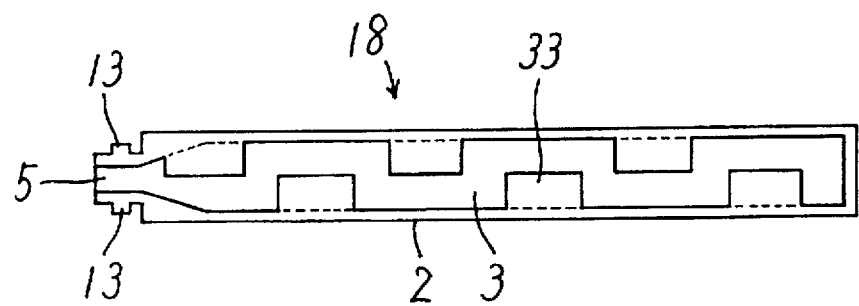
FIG. 4 is a view corresponding to FIG. 3, showing a cassette 18 storing electronic components according to a third embodiment of the present invention.

FIG. 4 is a view corresponding to FIG. 3. In the cassette 18 shown in FIG. 4, baffle walls 33 extend partially along the range of the thickness of the storage space 3. The baffle walls 33, which may not extend along the overall range of the thickness of the storage space 3 as shown in FIG. 4, preferably extend along a range exceeding half the thickness of the storage space 3.

Figure 5:
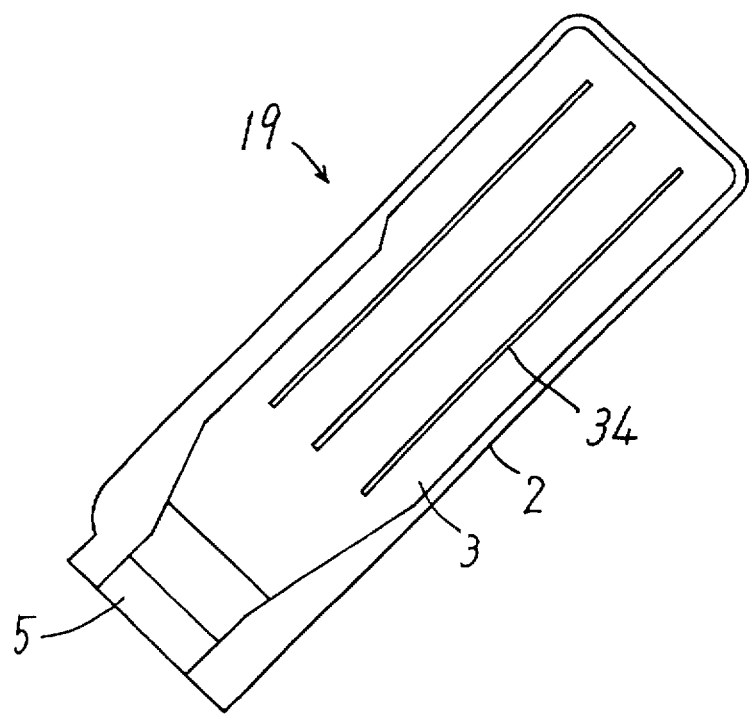
FIG. 5 is a view corresponding to FIG. 1, showing a cassette 19 storing electronic components according to a fourth embodiment of the present invention.

In the cassette 19 shown in FIG. 5, baffle walls 34 are arranged in three lines to extend in series along the longitudinal direction of the case 2.

Figure 6:
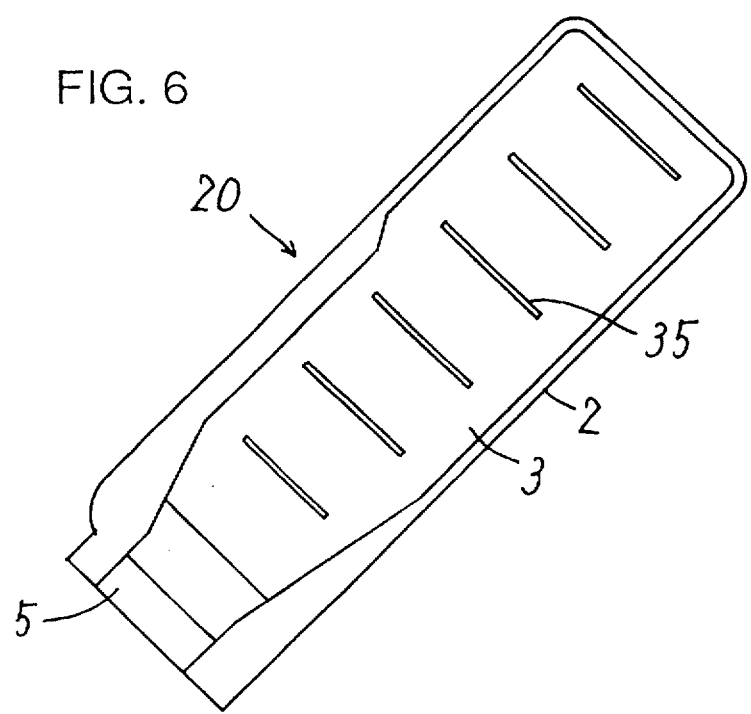
FIG. 6 is a view corresponding to FIG. 1, showing a cassette 20 storing electronic components according to a fifth embodiment of the present invention.

The cassette 20 shown in FIG. 6 is provided with a plurality of baffle walls 35 extending perpendicularly to the longitudinal direction of the case 2.

Figure 7:
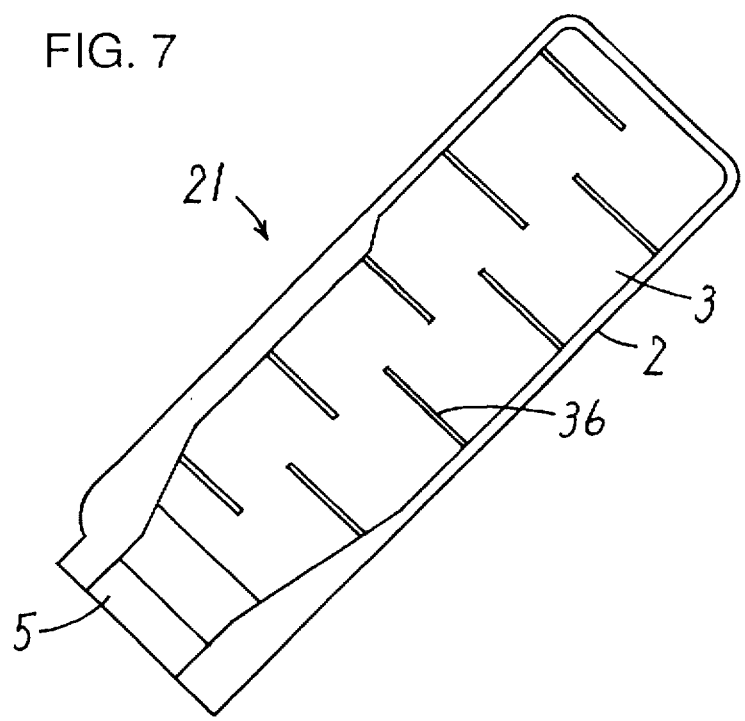
FIG. 7 is a view corresponding to FIG. 1, showing a cassette 21 storing electronic components according to a sixth embodiment of the present invention.

In the cassette 21 shown in FIG. 7, baffle walls 36 extend from opposite wall surfaces extending along the longitudinal direction of the case 2 respectively. Terminations of the respective baffle walls 36 are positioned around the central portion of the storage space 3 along its width, while those of the baffle walls 36 extending from one of the wall surfaces are located between adjacent ones of the remaining baffle walls 36 extending from the other wall surface, thereby defining a zigzag path in the storage space 3.

Figure 8:
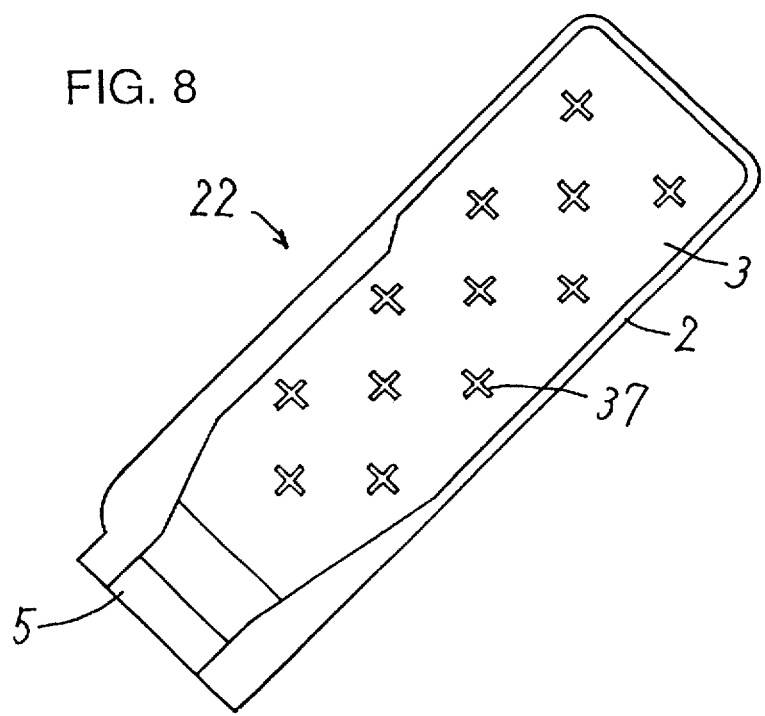
FIG. 8 is a view corresponding to FIG. 1, showing a cassette 22 storing electronic components according to a seventh embodiment of the present invention.

In the cassette 22 shown in FIG. 8, a plurality of columnar baffle walls 37 having X-shaped sections are provided in the storage space 3.

Figure 9:
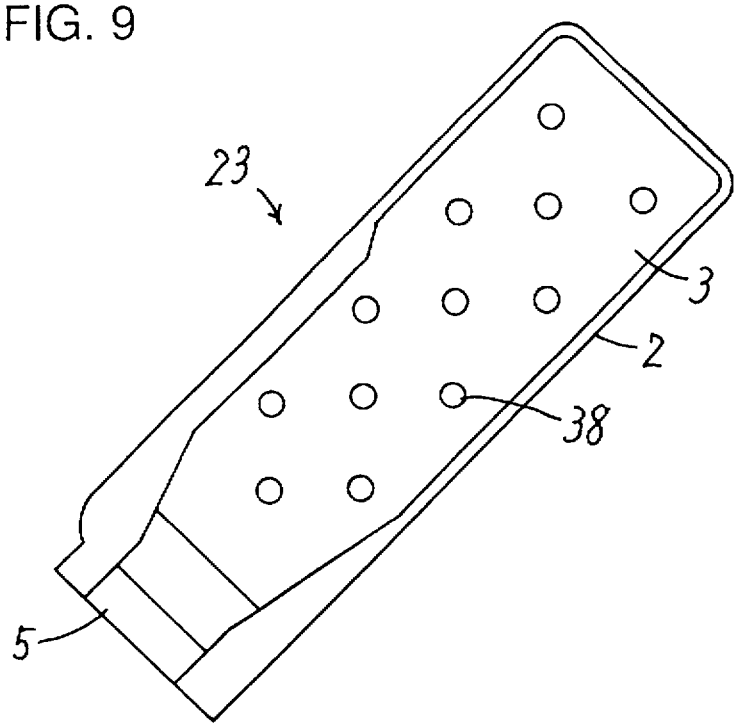
FIG. 9 is a view corresponding to FIG. 1, showing a cassette 23 storing electronic components according to an eighth embodiment of the present invention.

In the cassette 23 shown in FIG. 9, a plurality of cylindrical baffle walls 38 are provided in the storage space 3.

Figure 10:
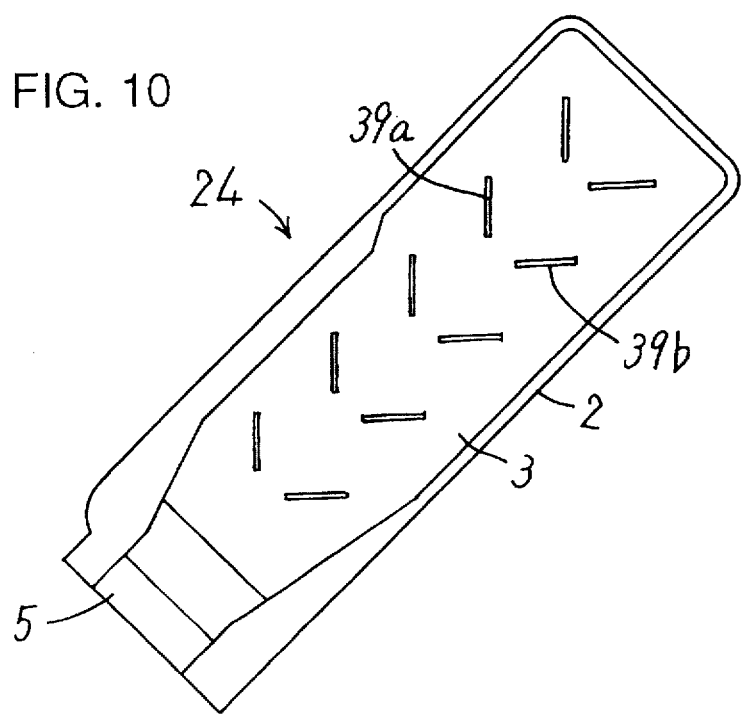
FIG. 10 is a view corresponding to FIG. 1, showing a cassette 24 storing electronic components according to a ninth embodiment of the present invention.

In the cassette 24 shown in FIG. 10, a plurality of plate type baffle walls 39a and a plurality of plate type baffle walls 39b are arranged in different lines, to extend in the vertical and horizontal directions respectively upon inclination of the case 2 at about 45°.

Figure 11:
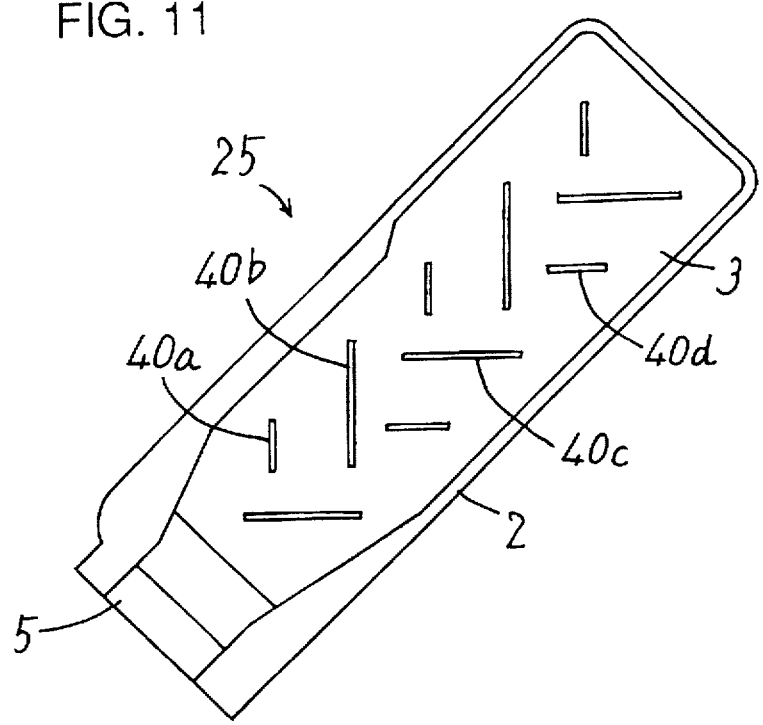
FIG. 11 is a view corresponding to FIG. 1, showing a cassette 25 storing electronic components according to a tenth embodiment of the present invention.

In the cassette 25 shown in FIG. 11, a plurality of relatively short and long plate type baffle walls 40a and 40b as well as a plurality of relatively long and short plate type baffle walls 40c and 40d are provided to extend in the vertical and horizontal directions respectively upon inclination of the case 2 at about 45°. The baffle walls 40a and 40b as well as 40c and 40d are arranged to form different lines, while the relatively short baffle walls 40a and 40d are so distributed as to fill clearances of distribution regions of the relatively long baffle walls 40a and 40c.

Figure 12:
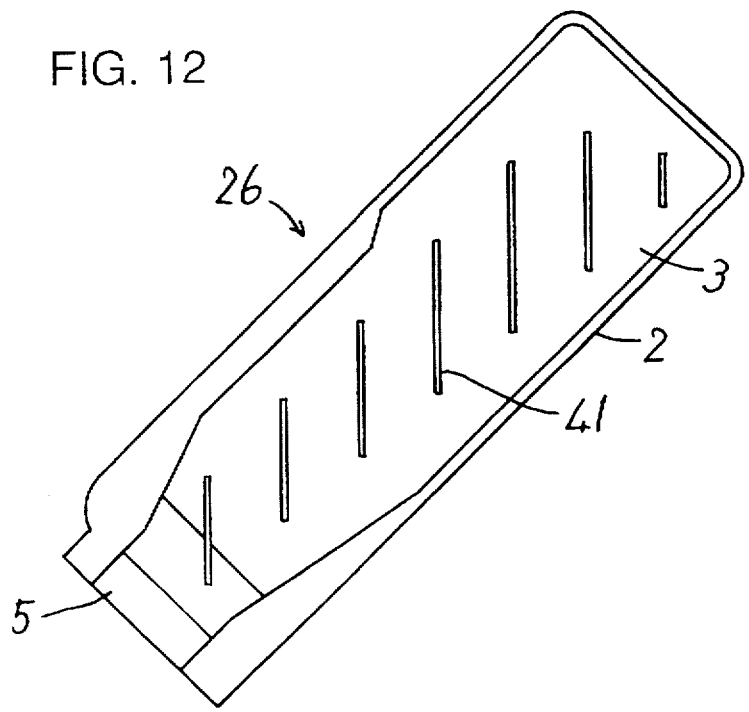
FIG. 12 is a view corresponding to FIG. 1, showing a cassette 26 storing electronic components according to an eleventh embodiment of the present invention.

In the cassette 26 shown in FIG. 12, a plurality of plate type baffle walls 41 are provided to extend in the vertical direction upon inclination of the case 2 at about 45°. Each baffle wall 41 is in a mode corresponding to that continuously connecting those of the baffle walls 31, shown in FIG. 1, extending flush with each other.

Figure 13:
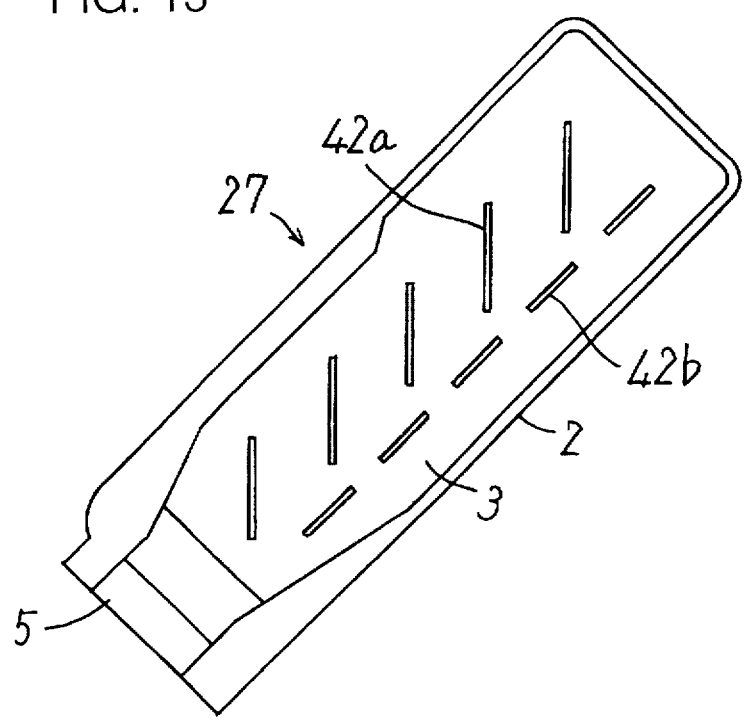
FIG. 13 is a view corresponding to FIG. 1, showing a cassette 27 storing electronic components according to a twelfth embodiment of the present invention.

The cassette 27 shown in FIG. 13 is provided with a plurality of plate type baffle walls 42a extending in the vertical direction upon inclination of the case 2 at about 45°, and a plurality of plate type baffle walls 42b extending in the longitudinal direction of the case 2. The baffle walls 42a and 42b are arranged to form different lines.

Figure 14:
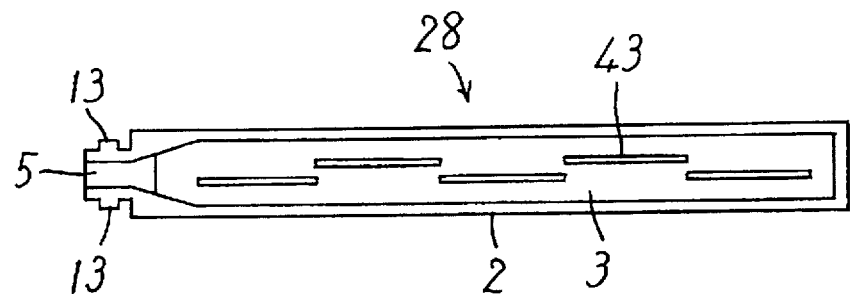
FIG. 14 is a view corresponding to FIG. 3, showing a cassette 28 storing electronic components according to a thirteenth embodiment of the present invention.
Figure 15:
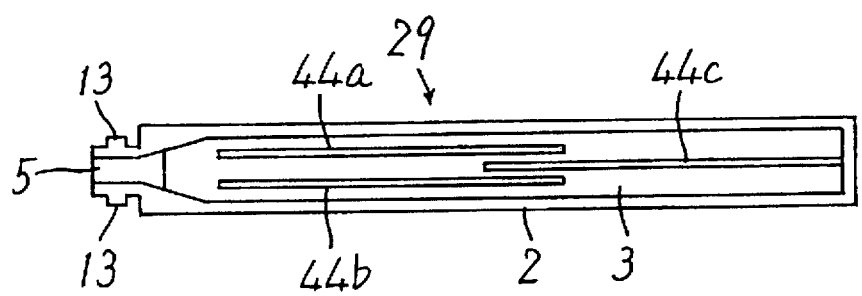
FIG. 15 is a view corresponding to FIG. 3, showing a cassette 29 storing electronic components according to a fourteenth embodiment of the present invention.
Figure 16:
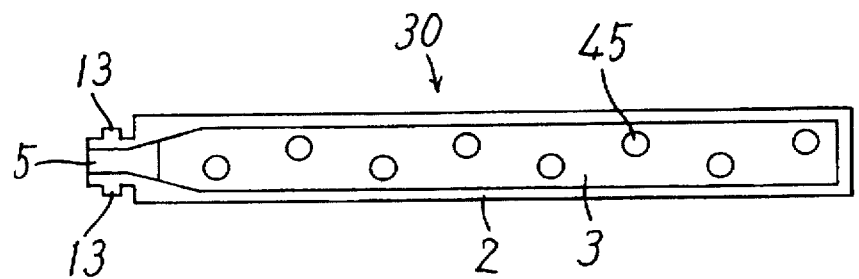
FIG. 16 is a view corresponding to FIG. 3, showing a cassette 30 storing electronic components according to a fifteenth embodiment of the present invention.

While the baffle walls are provided to extend along the thickness of the storage space 3 in each of the embodiments shown in FIGS. 1 to 13, such baffle walls may alternatively extend in the longitudinal direction or along the width of a storage space 3, as shown in each of the following embodiments shown in FIGS. 14 to 16.

The cassette 28 shown in FIG. 14 is provided with a plurality of plate type baffle walls 43 extending along the width of the storage space 3. The plurality of baffle walls 43 are alternately arranged on different positions along the thickness of the storage space 3 in a zigzag manner.

In the cassette 29 shown in FIG. 15, a plurality of plate type baffle walls 44a, 44b and 44c having relatively wide areas are provided to extend in parallel with major surfaces of the case 2. The baffle walls 44a and 44b are arranged to overlap with each other, while part of the baffle wall 44c is located between the baffle walls 44a and 44b.

In the cassette 30 shown in FIG. 16, a plurality of cylindrical baffle walls 45 are provided to extend along the width of the storage space 3.

Each of the embodiments shown in FIGS. 14 to 16 is further effective for suppressing movement of the electronic components particularly when the cassette 28, 29 or 30 is moved along the thickness of the storage space 3.

While the present invention has been described with reference to the embodiments shown in the drawings, the shapes, directions, number etc. of the baffle walls can be arbitrarily changed so far as the same will not inhibit the electronic components from being discharged and charged through the discharge port 5.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cassette for operable inclined attachment to a hopper of an apparatus for mounting electronic components to discharge a plurality of freely movable electronic components by gravitational free-fall into an aligning passage within said hopper, said cassette comprising:

a case which defines a storage space in its interior for storing a plurality of electronic components which are unaligned and freely movable within said storage space, said case further comprising a discharge port configured for operable attachment to said aligning passage, and for communicating with said storage space for discharging said unaligned electronic components to said aligning passage wherein said freely movable electronic components are aligned in a predetermined direction in said aligning passage; and at least one baffle wall included in said interior for partially blocking movement of said plurality of electronic components within said storage space:

wherein said case comprises a lower interior surface defined in the direction of the length of said case, wherein said at least one baffle is independent from said lower surface of said case to the extent that movement of said electronic components toward said discharge port is possible when said case is inclined.

2. A cassette according to claim 1, having three dimensional sizes including sizes of a first direction and a second direction to which said electronic components are supplied in accordance with gravity and a size of a third direction crossing said first and second directions, wherein said at least one baffle wall is provided to limit a space in said third direction.

3. A cassette according to claim 1, wherein movement of said hopper discharges said freely movable electronic components, and wherein said interior is defined by a width, a height, and said length which is perpendicular to said width and said height, said freely movable electronic components being operably discharged along said length of said interior during movement of said hopper.

4. A cassette according to claim 3, further including:

a plurality of baffle walls which extend in a vertical direction upon inclination of said cassette at about 45° relative to a longitudinal direction along said length, said plurality of electronic components being freely movable in a horizontal direction perpendicular to said longitudinal direction.

5. A cassette according to claim 3, further including:

a plurality of plate type baffle walls, said plurality of baffle walls being arranged in three lines parallel to a longitudinal direction along said length of the cassette.

6. A cassette according to claim 3, further including:
a plurality of baffle walls, each of which extends along said width of said interior.

7. A cassette according to claim 3, further including:
a plurality of baffle walls, each of which extends partially along a range of said width of said interior.

8. A cassette according to claim 3, further including:
a plurality of baffle walls, each of which extends perpendicular to a longitudinal direction along said length of the cassette.

9. A cassette according to claim 8, wherein each of said plurality of baffle walls extends from at least one wall surface of said cassette.

10. A cassette according to claim 3, further including:
a first plurality of plate type baffle walls and a second plurality of plate type baffle walls arranged along different lines parallel to said length of the cassette, each of said first and second plurality of baffle walls being arranged with an inclination of about 45° with respect to a longitudinal direction along said length of the cassette.

11. A cassette according to claim 3, further including:
a first plurality of plate type baffle walls, and a second plurality of plate type baffle walls, each of said baffle walls in said second plurality being longer than said baffle walls of said first plurality.

12. A cassette according to claim 3, further including:
a first plurality of baffle walls arranged at a first position along said width of said interior, and a second plurality of said baffle walls arranged at a second position along said width of said interior.

13. A cassette according to claim 3, further including:
a first plurality of baffle walls and a second plurality of baffle walls, said second plurality of baffle walls overlapping said first plurality of baffle walls.

14. An apparatus for mounting electronic components comprising:
a hopper for discharging a plurality of electronic components, said hopper having an aligning passage for aligning said plurality of electronic components in a predetermined direction of said aligning passage; and
a cassette for storing said plurality of electronic components and for supplying said plurality of electronic components to said hopper, said cassette further comprising:
a case which defines a storage space in its interior for storing said plurality of electronic components, wherein said electronic components are unaligned and freely movable within said storage space, said case further comprising a discharge port configured for operable attachment to said aligning passage, and for communicating with said storage space for discharging said unaligned freely movable electronic components to said aligning passage wherein said freely movable electronic components are aligned in said predetermined direction of said aligning passage; and
at least one baffle wall included in said interior for partially blocking movement of said plurality of electronic components within said storage space;
wherein said cassette is attached to said hopper such that said case is inclined;
wherein said case comprises a lower interior surface defined in the direction of the length of said case, wherein said at least one baffle is independent from said lower surface of said case to the extent that movement of said electronic components toward said discharge port is possible when said case is inclined.

15. A cassette according to claim 1, wherein said electronic components are chip-type components.

16. An apparatus according to claim 14, wherein said electronic components are chip-type components.

17. A cassette for operable attachment to discharge a plurality of freely movable electronic components into an aligning passage within a hopper of an apparatus for mounting electronic components, said cassette comprising:
a case which defines a storage space in its interior for storing a plurality of electronic components which are unaligned and freely movable within said storage space, said case further comprising a discharge port configured for operable attachment to said aligning passage, and for communicating with said storage space for discharging said unaligned electronic components to said aligning passage wherein said freely movable electronic components are aligned in a predetermined direction in said aligning passage; and
at least one baffle wall included in said interior for partially blocking movement of said plurality of electronic components within said storage space;
wherein movement of said hopper discharges said freely movable electronic components, and wherein said interior is defined by a width, a height, and a length which is perpendicular to said width and said height, said freely movable electronic components being operably discharged along said length of said interior during movement of said hopper;
wherein said at least one baffle wall includes a plurality of columnar baffle walls having X-shaped cross-sections.

18. A cassette for operable attachment to discharge a plurality of freely movable electronic components into an aligning passage within a hopper of an apparatus for mounting electronic components, said cassette comprising:
a case which defines a storage space in its interior for storing a plurality of electronic components which are unaligned and freely movable within said storage space, said case further comprising a discharge port configured for operable attachment to said aligning passage, and for communicating with said storage space for discharging said unaligned electronic components to said aligning passage wherein said freely movable electronic components are aligned in a predetermined direction in said aligning passage; and
at least one baffle wall included in said interior for partially blocking movement of said plurality of electronic components within said storage space;
wherein movement of said hopper discharges said freely movable electronic components, and wherein said interior is defined by a width, a height, and a length which is perpendicular to said width and said height, said freely movable electronic components being operably discharged along said length of said interior during movement of said hopper;
wherein said at least one baffle wall includes a plurality of cylindrical baffle walls.

19. A cassette for operable attachment to discharge a plurality of freely movable electronic components into an aligning passage within a hopper of an apparatus for mounting electronic components, said cassette comprising:
a case which defines a storage space in its interior for storing a plurality of electronic components which are unaligned and freely movable within said storage space, said case further comprising a discharge port configured for operable attachment to said aligning passage, and for communicating with said storage space for discharging said unaligned electronic components to said aligning passage wherein said freely movable electronic components are aligned in a predetermined direction in said aligning passage; and at least one baffle wall included in said interior for partially blocking movement of said plurality of electronic components within said storage space;

wherein movement of said hopper discharges said freely movable electronic components, and wherein said interior is defined by a width, a height, and a length which is perpendicular to said width and said height, said freely movable electronic components being operably discharged along said length of said interior during movement of said hopper;

wherein said at least one baffle wall includes a first plurality of plate type baffle walls, and a second plurality of plate type baffle walls, each of said baffle walls in said second plurality being longer than said baffle walls of said first plurality;

wherein said first plurality of baffle walls extend in a vertical direction upon inclination of said cassette at about 45° relative to a longitudinal direction along said length, while said second plurality of baffle walls extend in said longitudinal direction.

20. A cassette for operable attachment to discharge a plurality of freely movable electronic components into an aligning passage within a hopper of an apparatus for mounting electronic components, said cassette comprising:

a case which defines a storage space in its interior for storing a plurality of electronic components which are unaligned and freely movable within said storage space, said case further comprising a discharge port configured for operable attachment to said aligning passage, and for communicating with said storage space for discharging said unaligned electronic components to said aligning passage wherein said freely movable electronic components are aligned in a predetermined direction in said aligning passage; and at least one baffle wall included in said interior for partially blocking movement of said plurality of electronic components within said storage space;

wherein said at least one baffle wall is attached to at least one interior wall of said case such that passage of said electronic components toward said discharge port is possible when said case is inclined.

21. A cassette according to claim 20, wherein said case comprises a lower interior surface defined in the direction of the length of said case, wherein said at least one baffle is independent from said lower surface of said case.

22. A cassette according to claim 21, wherein said at least one baffle does not come into contact with said lower surface.

* * * * *